United States Patent [19]

Yoon

[11] Patent Number: 4,999,312

[45] Date of Patent: Mar. 12, 1991

[54] DOPING METHOD USING AN OXIDE FILM AND A NITRIDE FILM ON THE TRENCH WALL TO MANUFACTURE A SEMICONDUCTOR DEVICE AND THE MANUFACTURED DEVICE

[75] Inventor: Yong H. Yoon, Seoul, Rep. of Korea

[73] Assignee: Hyundai Electronics Industries Co., Ltd., Kyungki, Rep. of Korea

[21] Appl. No.: 394,380

[22] Filed: Aug. 16, 1989

[30] Foreign Application Priority Data

Aug. 18, 1988 [KR] Rep. of Korea .................. 10483/88

[51] Int. Cl.$^5$ ............................................. H01L 21/70
[52] U.S. Cl. ....................................... 437/52; 437/38; 437/47; 437/51; 437/60; 437/164; 437/919; 437/233
[58] Field of Search ....................... 437/38, 47, 51, 52, 437/60, 203, 919, 643, 161, 162, 163, 164, 233; 156/644; 357/23.6, 51

[56] References Cited

U.S. PATENT DOCUMENTS

| | | | |
|---|---|---|---|
| 4,569,701 | 2/1986 | Oh | 437/164 |
| 4,676,847 | 6/1987 | Lin | 437/919 |
| 4,734,384 | 3/1988 | Tsuchiya | 437/52 |
| 4,824,793 | 4/1989 | Richardson et al. | 437/52 |

FOREIGN PATENT DOCUMENTS 2199696  7/1988  United Kingdom ............... 357/23.6

Primary Examiner—Brian E. Hearn
Assistant Examiner—Tom Thomns
Attorney, Agent, or Firm—Ladas & Parry

[57] ABSTRACT

A doping method using an oxide film and a nitride film on a trench wall as a protective film to prevent the impurity from diffusing into the silicon wafer adjacent to the outer wall and to enable the formation of a substantially flat interface between the first and the second trench to provide a smooth step difference between the first trench and the second trench is disclosed. A highly integrated semiconductor device having a trench comprising a first trench having a bottom and with a second trench formed in the bottom of the first trench with an interface between the first trench and the second trench characterized by the interface between the first and the second trench being substantially flat to provide a smooth step difference between the first trench and the second trench is also disclosed.

2 Claims, 3 Drawing Sheets

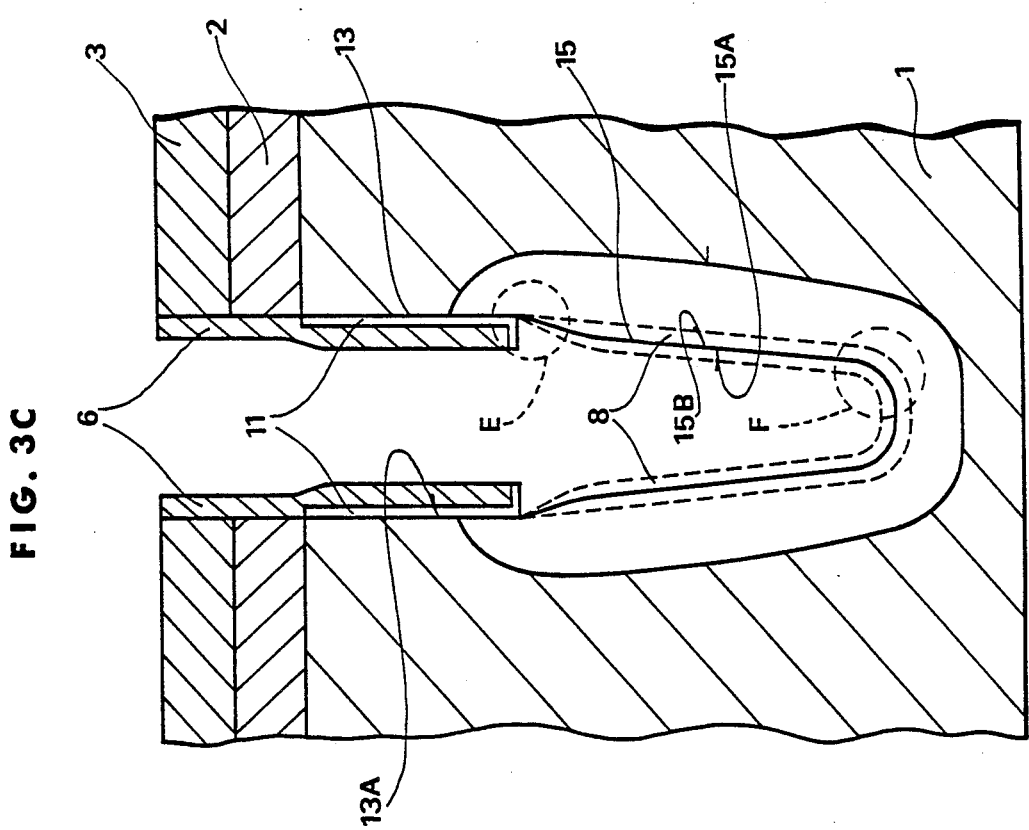
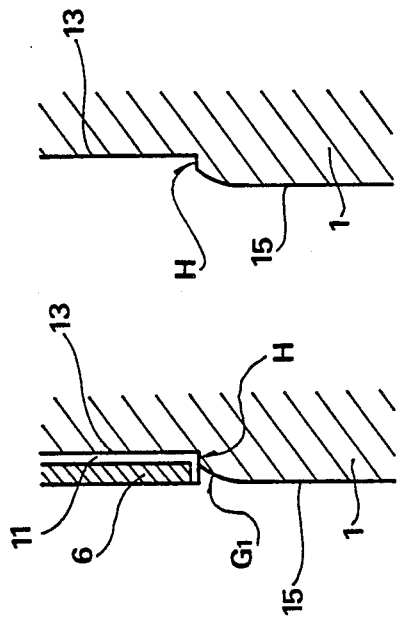
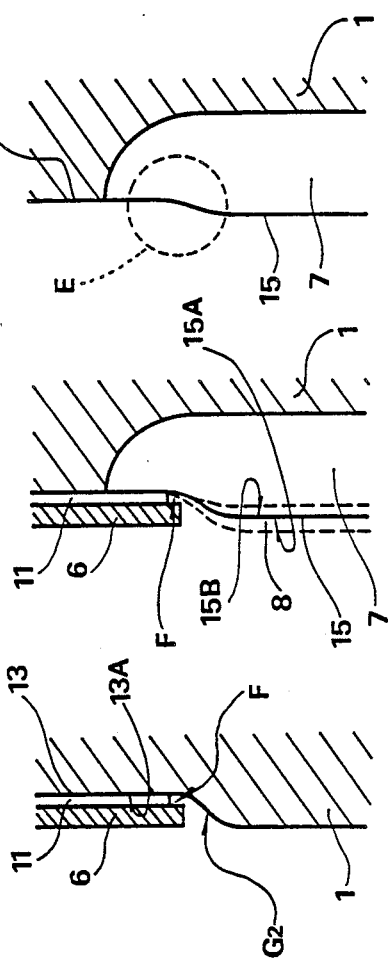

DOPING METHOD USING AN OXIDE FILM AND A NITRIDE FILM ON THE TRENCH WALL TO MANUFACTURE A SEMICONDUCTOR DEVICE AND THE MANUFACTURED DEVICE

BACKGROUND OF THE INVENTION

Field of the Invention

This invention relates to a DRAM (Dynamic Random Access Memory) cell, having a particular trench structure, for highly integrated semiconductor device above the 4 mega bit capacity DRAM and to a method for manufacturing the semiconductor device, and more particularly, to a DRAM cell, having a trench structure, for a VLSI (Very Large Scale Integrated) semiconductor device, and to a method for doping a side wall of the trench by using an oxide film and a nitride film.

INFORMATION DISCLOSURE STATEMENT

In the prior art, during the implantation of the impurity an oxide film is used on the inner wall of the first trench as a protective film to prevent the impurity from diffusing into the silicon wafer adjacent to the outer wall of the first trench. This structure presents a problem in that the oxide film can not completely act as a protective film, due to the partial etching of the oxide film by the etching solution used during the rinsing process, for rinsing the inside of trench, which is performed after forming the second trench. Accordingly, the impurity of the dopant source, such as BSG (Boro-Silica-Glass), as PSG (Phosphorous-Silica-Gears) diffuses into the silicon wafer adjacent to the outer wall of the first trench through the area where the oxide film has been partially etched, when a P+ or N+ type impurity doped region is being formed by the diffusion process in the silicon wafer adjacent to the outer wall of the second trench.

Further, in the prior art process, after the second trench is formed, the trench is rinsed with an oxide etching solution, for example, a HF solution, to remove the etching reaction products from the surface of the inner wall of the second trench, and to make uniform arrangement of the silicon in the inner wall of the second trench. However, the protection of the oxide film is lost if the rinsing process is conducted for too long a time relative to the thickness of the oxide film. In other words, if the oxide film on the inner wall of the first trench, that is, the protective film, does not have a sufficient thickness, the impurity diffuses into the silicon wafer adjacent to the outer wall of the first trench during the implantation of the impurity, such as BSG. Therefore, the oxide film must be thick enough to protect against impurity diffusion after the rinsing process is performed.

However, if the oxide film is too thick in order to avoid the problem mentioned above, a big difference results at the interface between the first and second trenches lessening the desirability of the resulting device.

On the other hand, if the time period for the rinsing process is too short, the reaction products produced during the formation of the second trench will remain resulting in a problem where a uniformly doped region cannot be obtained when the impurity doped region is formed.

Accordingly, it is an object of the present invention to provide an improved semiconductor device having a trench structure which can solve the disadvantages of the above mentioned prior art trench structure.

It is a further object of the present invention to provide a method for doping a side wall of the trench using an oxide film and a nitride film for the semiconductor device, in which the method comprises forming thin oxide film as a protective film, depositing a nitride film thereon, performing an oxidation process at the inner wall of the second trench, thereby reducing a step difference resulting from thickness of the oxide film which is only used as a protective film in the prior art.

It is another object of the present invention to provide a semiconductor device in which the oxide film is protected by the nitride film during the rinsing process, thereby protecting the impurity of dopant source, such as BSG, from diffusing into the silicon wafer adjacent to the outer wall of the first trench during the diffusion process.

It is another object of the present invention to form a selectively doped region along an outer wall of the trench with high reproductivity and reliability, comprising forming a first trench on a silicon wafer, forming a protective layer having an oxide film which is to prevent an impurity from diffusing into the silicon wafer adjacent to the outer wall of the first trench and a nitride film deposited on the oxide film which is to prevent the oxide film from being etched during a rinsing process, froming a second trench in the silicon wafer at the bottom of the first trench, depositing a dopant source on the inner wall of the second trench, and diffusing an impurity of the dopant into the silicon wafer adjacent to the outer wall of the second trench.

SUMMARY OF THE INVENTION

This invention relates to a method for manufacturing a semiconductor device and the resulting semiconductor device manufactured by the method according to the present invention. The present invention comprises a doping method for a side wall of a trench capacitor which includes providing a silicon wafer and sequentially forming a mask layer comprising a first oxide layer, a nitride layer and a second oxide layer on the silicon wafer. A photoresist layer is then deposited on the second oxide layer and a first mask pattern is formed by removing a portion of the photoresist layer to expose a portion of the second oxide layer. A second mask pattern is formed by removing the portion the exposed second oxide layer, the nitride layer and first oxide layer underlying the exposed second oxide layer to expose the silicon wafer. Any remaining photoresist layer is removed. A first trench having an inner wall and an outer wall and a bottom is formed by etching in the silicon wafer exposed by the formation of the second mask pattern. The first trench is then rinsed to remove the etching reaction products. An oxide film is deposited on the inner wall and the bottom of the first trench. The oxide film may also be formed by known methods. A nitride film is formed on the entire surface of the oxide film and on the mask layer, i.e. the edges of the first oxide layer, the nitride layer and the second oxide layer formed by the second mask pattern process and which make up the mask layer. The nitride film is also formed on the the second oxide layer of the mask layer. A portion of the oxide film and the nitride film is removed from the bottom of the first trench concurrently with removing the nitride film formed on the second oxide layer of the mask layer by means of an anisotropic etching process. The second oxide layer beneath the nitride film is then removed. A second trench is formed in the silicon wafer, exposed by removing a portion of the nitride and the oxide film, from the bottom of the first trench. The second trench is then rinsed. A dopant source is deposited on the entire surface of the inner wall of the second trench, the nitride film and the nitride layer. An impurity doped region is then formed in the silicon wafer adjacent to the outer wall of said second trench. An oxidation region is formed on the inner and outer walls of the second trench by performing an oxidation process along the inner wall of the second trench having the impurity doped region on the outer wall thereof. The nitride film and the oxide film formed on the inner wall of the first trench is removed, and the oxidation region formed on the inner and outer wall of the second trench is also removed to thereby provide a substantially flat interface between the first trench and second trench to form a smooth step difference between the first trench and the second trench.

Preferably, the impurity doped region in the silicon wafer adjacent to the outer wall of the second trench is formed by a drive-in process known in the art.

The present invention also includes the highly integrated semiconductor device fabricated by the method set forth above. The highly integrated semiconductor device according to the present invention includes a trench having a first trench with a bottom and a second trench formed in the bottom of the first trench with an interface between the first trench and the second trench characterized in that the interface between the first and second trench is substantially flat thereby providing a smooth step difference between the first trench and the second trench.

BRIEF DESCRIPTION OF THE DRAWINGS

For fuller understanding of the nature and objects of the invention, reference should be had to the following detailed description taken in conjunction with the accompanying drawing in which;

FIG. 3C illustrates a cross-section of the silicon wafer in which a oxidation region is formed inside and outside the impurity doped region by an oxidation process described in conjunction with FIG. 3B;

FIG. 4A illustrates an enlarged cross-section showing only the interface between the first trench and the second trench after the second trench is formed;

FIG. 4B illustrates an enlarged cross-section with a step difference at the interface between the first trench and the second trench after the protective film has been removed;

FIG. 4C illustrates an enlarged cross-section in which a bottom portion of the oxide film on the inner wall of the first trench is etched during a rinsing process after forming the second trench;

FIG. 4D illustrates a cross-section in which an oxidation process is performed along the inner wall of the second trench after the impurity doped region is formed in the silicon wafer adjacent to the outer wall of the second trench; and FIG. 4E illustrates a schematic diagram in which after the oxidation process, the oxidation film and the nitride film are removed and the step difference at the interface between the first trench and the second trench is substantially reduced.

DETAILED DESCRIPTION

Photoresist etch back technology is fully described in U.S. Ser. No. 07/381,288 filed July 18, 1989, said application being expressly incorporated herein by reference as if fully set forth hereat. Teachings set forth in the above mentioned application may be used in the present invention to form the first mask pattern, FIG. 1B, the second mask pattern, FIG. 1C, and the first trench, FIG. 2A.

FIG. 1A through FIG. 3C are drawings explaining the method for doping a side wall of trench.

Figure 1A:
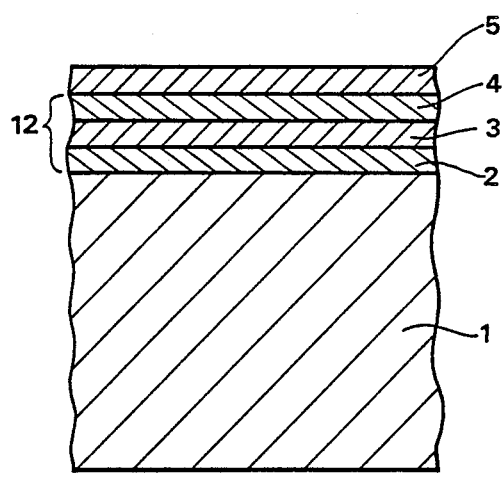
FIG. 1A illustrates a cross-section of a silicon wafer on which a photo-resist layer is formed after depositing a mask layer.

In FIG. 1A, the first oxide layer 2, the nitride layer 3 which is an etch stopping layer for preventing the surface of silicon wafer from being damaged by the RIE (Reactive Ion Etching) process, and the second oxide layer 4 formed on the nitride layer 3, are sequentially deposited on the silicon wafer 1 as a mask layer 12. The mask layer 12 comprising the above three layers 2,3,4 is thereby provided. A photoresist layer 5 is then deposited on the second oxide layer 4 to form a mask pattern In FIG. 1B, a first mask pattern 12A is formed by removing a portion of the photoresist having width "A" by known lithographic technology.

Figure 1B:
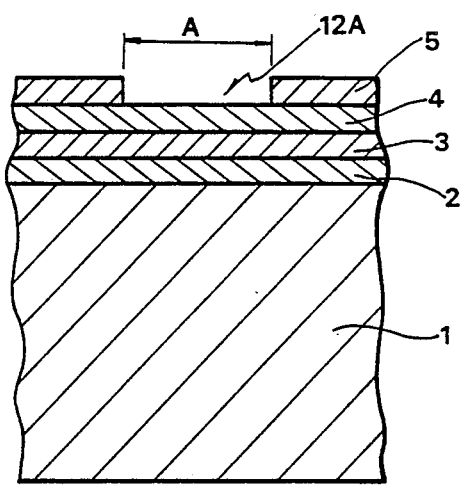
FIG. 1B illustrates a cross-section of the silicon wafer in which a first mask pattern is formed by removing a portion of the photoresist layer in FIG. 1A.
Figure 1C:
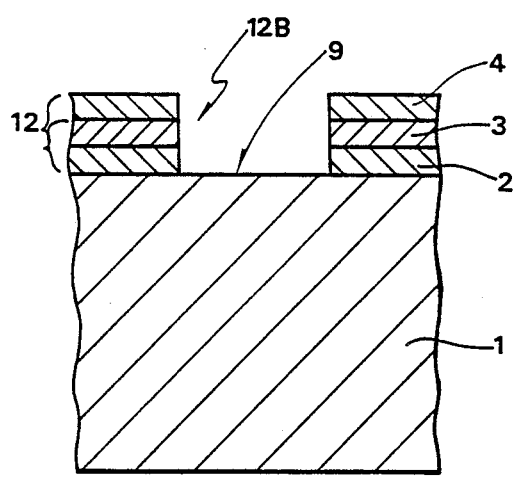
FIG. 1C illustrates a cross-section of the silicon wafer in which a second mask pattern is formed by removing a portion of the mask layer along the first mask pattern in FIG. 1B and then the remaining photoresist layer is removed.

In FIG. 1C, in order to form a second mask pattern 12B, the portion of the mask layer 12 which has been exposed by the process described in conjunction with FIG. 1B is removed along the first mask pattern 12A up to the top surface 9 of silicon wafer 1 using RIE technology, thereby forming a second mask pattern 12B. Then, any remaining photoresist layer 5 is removed by known etch-back technology, such as the oxygen plasma method.

Figure 2A:
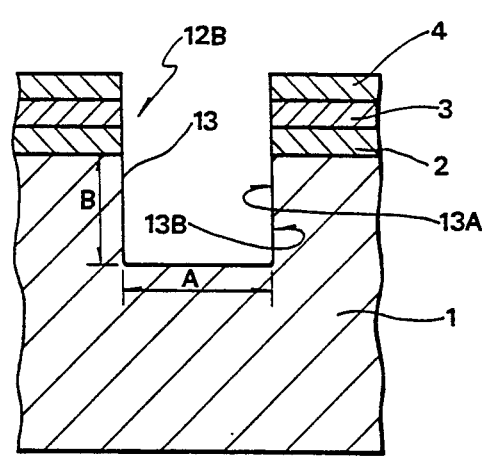
FIG. 2A illustrates a cross-section of the silicon wafer in which a first trench is formed on the silicon wafer portion exposed by the process described in conjunction with FIG. 1C.

In FIG. 2A, a first trench 13 having a width "A" for example, 1.0 micrometer×1.0 micrometer, and depth "B", for example, 2 micrometer, is formed along the second mask pattern 12B in the top surface 9 of the silicon wafer 1 by RIE etching. The trench 13 is then rinsed using HF solution. Here, the inner wall and the outer wall of the first trench 13 will be referred to 13A and 13B respectively.

It is noted that since the etching width and depth of the first trench is mainly determined in accordance with the desired P+ or N+ impurity doped region formed in the inner wall of a second trench. That is, the etching width and depth of the first trench depends on the desired features of the manufactured semiconductor device. More particularly, the etching width of the first trench depends on the design of a semiconductor device, and the etching depth thereof can be controlled by varying the etching condition, such as, etch time or etch rate.

Figure 2B:
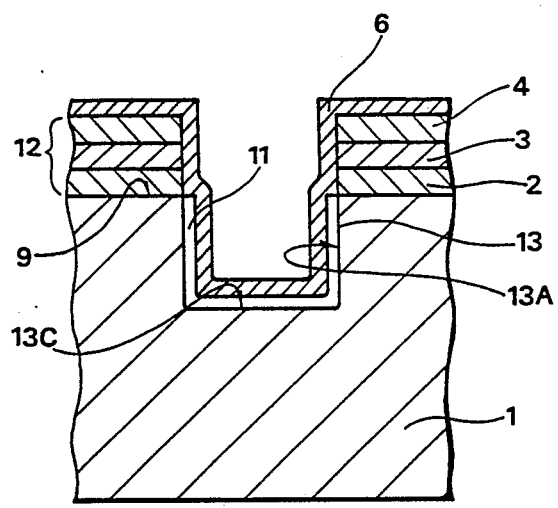
FIG. 2B illustrates a cross-section of the silicon wafer in which a protective film comprising an oxide film and a nitride film is deposited on an inner wall of the first trench formed by the process described in conjunction with FIG. 2A.

In FIG. 2B, a thin oxide film 11 is deposited as thick as for example 300 Angstrom, along the inner wall 13A of the trench 13 up to the top surface 9 of the silicon wafer 1 by thermal oxidation process. Then, the nitride film 6 is deposited, for example 500 Angstrom, on the oxide film 11 in the trench 13 and the entire surface of the mask layer 12 as shown. This provides a double protective film comprising the nitride film 6 and the oxide film 11 in the trench 13.

Figure 2C:
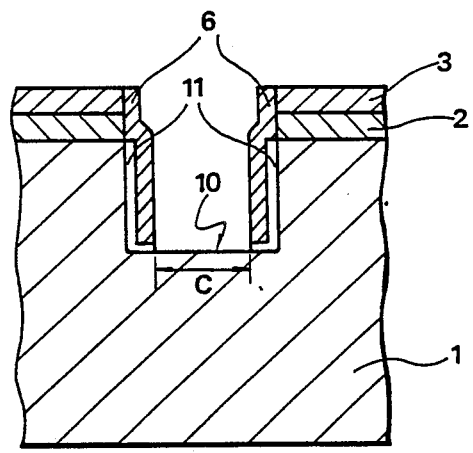
FIG. 2C illustrates a cross-section of the silicon wafer in which a portion of the silicon wafer is exposed by removing a portion of the protective film on the mask layer and the bottom of the first trench in FIG. 2B.

In FIG. 2C, a portion of the nitride film 6 located on the mask layer 12 and the bottom 13C of the trench 13 is removed by the known anisotropic etching technology, and a portion of the thin oxide film 11 is removed by the RIE from the bottom 13C of the trench 13. As result of the RIE process, a portion of the surface 10 of the silicon wafer 1 is exposed. At the same time, the second oxide layer 4 is also removed.

Figure 3A:
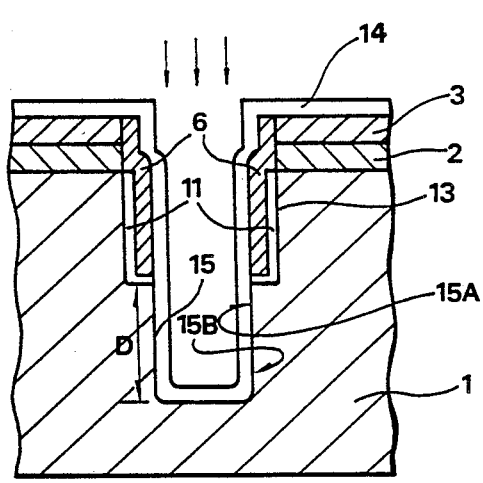
FIG. 3A illustrates a cross-section of the silicon wafer in which a second trench is formed at the silicon wafer which is exposed at the bottom of the first trench by the process described in conjunction with FIG. 2C, and then a heat treatment is performed after a dopant source is deposited on the nitride film, and inner walls of the first and second trenches.

Referring FIG. 3A, the second trench 15 having width "C", for example 1.0 micrometer × 1.0 micrometer, and depth "D", for example 3.0 micrometer, is formed in the surface 10 of the silicon wafer 1 exposed by the process explained in conjunction with FIG. 2C. A rinsing process using HF solution is then performed for rinsing the inside of the trench. After this, in order to form a P+ or N+ impurity doped region in the silicon wafer adjacent to the outer wall 15B of the second trench 15, a dopant source 14, such as BSG, is deposited on the nitride layer 3, the protective film, that is, the nitride film 6, of the first trench 13, and the inner wall 15A of the second trench 15. Then, the impurity contained the dopant source 14 is diffused into the silicon wafer 1 adjacent to the outer wall 15B of the second trench 15 by means of the drive-in process. Here, it should be noted that the nitride film 6 and the oxide film 11 formed on the inner wall 13A of the first trench 13 act as a protective film so that the dopant source 14 cannot diffuse into the silicon wafer 1 adjacent to the outer wall 13B of the first trench 13.

Figure 3B:
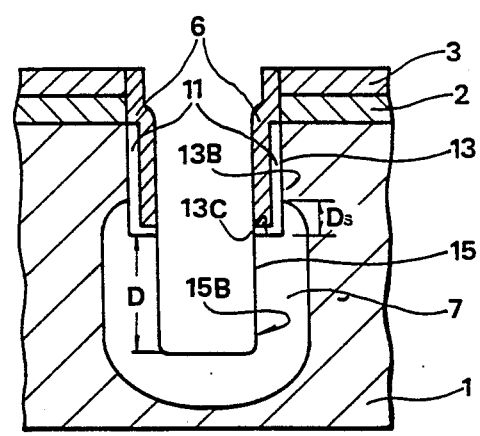
FIG. 3B illustrates a cross-section of the silicon wafer in which a remained dopant is removed after a P+ or N+ type impurity doped region is formed in the silicon wafer by the process described in conjunction with FIG. 3A.

Referring FIG. 3B, after the P+ or N+ impurity doped region 7 is formed in the silicon wafer 1 adjacent to the outer wall 15B of the second trench 15 by the impurity doping process, the remained dopant source 14 is removed. In the meantime, it should be understood that a portion of the impurity doped region formed in the silicon wafer 1 adjacent to the outer wall 13B up to a distance, Ds, from the bottom 13C of the first trench 13 is formed upward by the diffusion process which is performed for forming the impurity doped region 7 on the outer wall 15B of the second trench 15 in the silicon wafer 1.

Referring FIG. 3C, after the process described in conjunction with FIG. 3B, an oxidation process is performed along the inner wall 15A of the trench 15. The above oxidation process forms an oxidation region 8 at the inner wall 15A and outer wall 15B of the trench 15. In actuality oxidation occurs both at the surface of the inner wall 15A and in the outer wall 15B of the second trench 15. After the above oxidation process, the nitride film 6, the oxide film 11 and the oxidation region 8 formed on the inner wall 15A and outer wall 15B of the first trench 15 are removed. By the process, the oxidation process rounds the bottom "F" of the second trench 15, and smoothly reduces (slopes) the step at the interface "E" between the first trench 13 and the second trench 15, which will be described in detail in conjunction with FIG. 4A and FIG. 4B.

FIG. 4A through 4E illustrate how the step "E" shown in FIG. 3C is formed, and sloped or reduced at the interface between the first trench 13 and the second trench 15.

FIG. 4A is a schematic sectional diagram showing a step difference "H" formed at the interface between the first trench 13 and the second trench 15 and also shown in FIG. 3A. After the first trench 13 is formed, an etching process is performed so as to form the second trench 15, etching at silicon wafer 1 near the interface is not achieved on a level with the second nitride film 6, but on a level relatively lower than the second nitride film 6, resulting in formation of a more etched portion "G1".

FIG. 4B is a schematic diagram in which only the silicon wafer 1 is taken, absent the second nitride film 6 and the third oxide film 11, from the FIG. 4A. From this drawing, step difference "H" can be easily seen and this is a structure before the oxidation process is performed.

FIG. 4C is a schematic diagram in which the silicon wafer 1 adjacent to the interface between the first trench 13 and the second trench 15 is further etched away, relative to FIG. 4A, by a rinsing process, resulting in formation of an etched portion "G2". Furthermore, this results in a portion "F" of the end of oxide film 11 formed on the inner wall 13A of the first trench 13 being etched away by a chemical reaction during the rinsing process.

FIG. 4D is a schematic diagram in which a P+ or N+ impurity doped region 7 is formed in the silicon wafer 1 adjacent at the outer wall 15B of the second trench 15 by the impurity diffusion process after the process described in conjunction with FIG. 4C. Then, by a known process, oxidation region 8 is formed on the outer wall 15B concurrently with the inner wall 15A at the second trench 15. As result of this, the oxidation region 8 reaches the portion "F" where the oxide film 11 is etched away, so that it is possible to reduce the step difference.

FIG. 4E is a schematic diagram in which after the process described in conjunction with FIG. 4D, the oxidation region 8 formed on the inner and outer walls 15A, 15B of the second trench 15 is removed by known techniques. The nitride film 6 and the oxide film 11, which function are a protective film, are removed thereby, substantially reducing the step difference at the interface "E" between the first trench 13 and the second trench 15. According to the process of the present invention, a substantially flat surface is formed which provides a smooth step difference "E" relative to the prior art.

In accordance with the present invention described above, using the protective film comprising the oxide film 11 and the nitride film 6, damage to the silicon wafer 1 occurring by the RIE during the etching for the trench can be also avoided.

Since the nitride film has a greater density than the oxide film, the loss of the protective film during etching is relatively less. Therefore, it is possible to protect the impurity from diffusing into the silicon wafer 1 with the protective film of the present invention having a thickness less than the thickness, for example over 2,000 Angstrom, of an oxide film which functions as a protective film in the prior art, and to effectively reduce the step difference between the first trench and the second trench.

Where an oxide film is used as the only protective film, the time required for the rinsing process is limited. However, according to the present invention, since the nitride film is added to the prior art protective film, namely an oxide film, the time for the trench rinsing process may be lengthened so that a clean trench can be obtained.

In addition, according to the present invention, the step difference at the interface between the first trench and the second trench can be effectively reduced, i.e. sloped, by the oxidation process after forming the second trench. Furthermore, an effective capacitive area is increased and the bottom of the second trench has a round shape, thereby, providing an improved and advanced semiconductor device.

The foregoing description of the preferred embodiment has been presented for propose of illustration and description. It is not intend to limit the scope of this invention. Many modification and variation are possible in the light of above teaching. It is intend that the scope of the invention be defined by the claim.

What is claimed is:

1. A doping method for a side wall of a trench capacitor comprising:

providing a silicon wafer;

sequentially forming a mask layer including a first oxide layer, a nitride layer and a second oxide layer on the silicon wafer and then depositing a photoresist layer on the second oxide layer;

forming a first mask pattern by removing a portion of the photoresist layer to expose a portion of the second oxide layer;

forming a second mask pattern by removing the portion of the exposed second oxide layer, the nitride layer and first oxide layer underlying the exposed second oxide layer to expose the silicon wafer;

removing any remaining photoresist layer;

forming a first trench having an inner wall and an outer wall and a bottom in the silicon wafer exposed by the formation of the second mask pattern and then rinsing the first trench;

depositing an oxide film on the inner wall and the bottom of the first trench and forming a nitride film on the entire surface of the oxide film, the mask layer including the second oxide layer of the mask layer;

removing a portion of the oxide film and the nitride film from the bottom of the first trench concurrently with removing the nitride film formed on the second oxide layer of the mask layer with n anisotropic etching process, and then removing the second oxide layer beneath the nitride film;

forming a second trench in the silicon wafer, exposed by removing a portion of the nitride and the oxide film, from the bottom of the first trench, and rinsing the second trench;

depositing a dopant source on the entire surface of the inner wall of the second trench, on the nitride film and on the nitride layer, with the oxide film and the nitride film on the first trench wall providing a protective film to prevent the impurity of the dopant source from diffusing into the silicon wafer adjacent to the outer wall of the first trench;

forming an impurity doped region in the silicon wafer adjacent to the outer wall of the second trench;

forming an oxidation region on the inner and outer walls of the second trench by performing an oxidation process along the inner wall of the second trench having the impurity doped region on the outer wall thereof; and removing the nitride film and the oxide film formed on the inner wall of the first trench, and removing the oxidation region formed on the inner and outer wall of the second trench thereby providing a substantially flat interface between the first and second trench to form a smooth step difference between the first trench and the second trench.

2. The method of claim 1 wherein the impurity doped region in the silicon wafer adjacent to the outer wall of the second trench is formed by performing a drive-in process.

* * * * *